United States Patent
Hayashi et al.

(10) Patent No.: US 11,670,522 B2
(45) Date of Patent: Jun. 6, 2023

(54) PROCESSING LIQUID GENERATOR AND SUBSTRATE PROCESSING APPARATUS USING THE SAME

(71) Applicant: SHIBAURA MECHATRONICS CORPORATION, Yokohama (JP)

(72) Inventors: Konosuke Hayashi, Yokohama (JP); Kunihiro Miyazaki, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 737 days.

(21) Appl. No.: 15/661,480

(22) Filed: Jul. 27, 2017

(65) Prior Publication Data

US 2018/0033651 A1 Feb. 1, 2018

(30) Foreign Application Priority Data

Jul. 29, 2016 (JP) .............................. JP2016-150832
Jun. 26, 2017 (JP) .............................. JP2017-124215

(51) Int. Cl.
*H01L 21/67* (2006.01)

(52) U.S. Cl.
CPC .... *H01L 21/67075* (2013.01); *H01L 21/6708* (2013.01); *H01L 21/67017* (2013.01)

(58) Field of Classification Search
CPC ........... H01L 21/6708; H01L 21/67017; H01L 21/6715; H01L 21/67253; H01L 21/68764;

(Continued)

(56) References Cited

U.S. PATENT DOCUMENTS 5,924,794 A * 7/1999 O'Dougherty .... B01F 15/00227
                                                    366/136
7,472,713 B2 * 1/2009 Amai ................ H01L 21/67051
                                                    134/104.1

(Continued)

FOREIGN PATENT DOCUMENTS

JP      2003-170034 A      6/2003
JP      2005-533639 A      11/2005

(Continued)

OTHER PUBLICATIONS

Office Action of Korean Patent Application No. 2017-0096397 dated Sep. 20, 2018.

*Primary Examiner* — Gordon Baldwin
*Assistant Examiner* — Kurt Sweely
(74) *Attorney, Agent, or Firm* — Kratz, Quintos & Hanson, LLP

(57) ABSTRACT

According to one embodiment, a processing liquid generator capable of improving the reliability of the concentration of generated processing liquid is provided.
A processing liquid generator that generates processing liquid having undergone concentration adjustment includes a processing liquid adjuster (11$a$), which adjusts the concentration of the processing liquid, a first processing liquid path P1, through which the processing liquid flows to the processing liquid adjuster (11$a$), a second processing liquid path P2, through which the processing liquid flows to the processing liquid adjuster 11$a$, a first concentration meter 201$a$, which measures the concentration of the processing liquid flowing through the first processing liquid path P1, the measured concentration being the concentration of a component involved in the concentration adjustment in the processing liquid adjuster (11$a$), a second concentration meter 201$b$, which measures the concentration of the processing liquid flowing through the second processing liquid path P2, the measured concentration being the concentration of a component that is involved in the concentration adjustment and should be measured with the first concentration meter 201$a$ in terms of concentration, a first valve mechanism 120$a$/130$a$, which opens and closes the first processing liquid path P1, and a second valve mechanism 120$b$/130$b$, which opens and closes the second processing liquid path P2.

19 Claims, 8 Drawing Sheets

(58) Field of Classification Search
CPC ......... H01L 21/67063; H01L 21/67075; H01L 21/67086; H01L 21/67023; H01L 21/67028; H01L 21/67034; H01L 21/6704; H01L 21/67046; H01L 21/67051; H01L 21/67069; F16K 37/005; Y10T 137/2499; Y10T 137/2501; Y10T 137/2504; Y10T 137/2506; Y10T 137/2509; G01D 3/08; G01D 18/00; G01M 99/00

See application file for complete search history.

(56) References Cited

U.S. PATENT DOCUMENTS

| | | | | |
|---|---|---|---|---|
| 8,132,402 | B2 * | 3/2012 | Toshioka | B01D 53/90 60/303 |
| 9,261,023 | B2 * | 2/2016 | Lawson | F16K 37/0091 |
| 2003/0066797 | A1 * | 4/2003 | Sasaki | H01L 21/6708 134/66 |
| 2003/0104959 | A1 | 6/2003 | Hiraoka | |
| 2004/0100860 | A1 | 5/2004 | Wilmer | |
| 2007/0106425 | A1 * | 5/2007 | Anderson | B01F 15/00207 700/265 |
| 2009/0139210 | A1 * | 6/2009 | Sanchez | G01N 27/4175 60/276 |
| 2013/0028043 | A1 * | 1/2013 | Fanjat | G05D 11/133 366/152.4 |
| 2014/0037506 | A1 * | 2/2014 | Miki | G01N 21/274 422/84 |
| 2014/0199841 | A1 | 7/2014 | Noller | |
| 2016/0062372 | A1 * | 3/2016 | Hayashi | B05B 12/006 118/712 |
| 2016/0271657 | A1 * | 9/2016 | Sato | H01L 21/67253 |

FOREIGN PATENT DOCUMENTS

| | | | |
|---|---|---|---|
| JP | 2005-347384 A1 | 12/2005 | |
| JP | 2013-197360 A | 9/2013 | |
| JP | 2014-527298 A | 10/2014 | |
| KR | 10-2008-0011910 A | 2/2008 | |
| KR | 10-0837673 B1 | 6/2008 | |
| WO | WO-2014185467 A1 * | 11/2014 | ....... H01L 21/67017 |

* cited by examiner

PROCESSING LIQUID GENERATOR AND SUBSTRATE PROCESSING APPARATUS USING THE SAME

BACKGROUND OF THE INVENTION

Field of the Invention

The present invention relates to a processing liquid generator that generates processing liquid used, for example, in the step of processing a semiconductor wafer and further relates to a substrate processing apparatus using the processing liquid generator.

Description of the Related Art

There is a known organic substance peeling apparatus of related art (an example of a substrate processing apparatus) described in Japanese Patent Laid-Open No. 2005-347384. The organic substance peeling apparatus supplies a surface of a semiconductor wafer (an example of a substrate) with chemical liquid (peeling processing liquid) to remove an organic substance, such as a photoresist, a polymer or the like, formed in manufacturing steps applied to the semiconductor wafer. In the organic substance peeling apparatus, components that form the chemical liquid and pure water are mixed with one another and circulated in a circulation tank (chemical liquid tank) with the concentration of each of the components and the concentration of the pure water measured with a concentration meter (organic component concentration meter, water concentration meter), and the components and pure water are so added to the circulation tank that the measured concentration values of each of the components and the pure water fall within predetermined ranges. Chemical liquid (peeling processing liquid) made of the components and the water the concentrations of which are held within the predetermined concentration ranges in the circulation tank is thus produced (function of processing liquid generator). The chemical liquid generated in the circulation tank is then supplied through a peeling liquid supply tube to the surface of the semiconductor wafer supported by a rotating stage.

According to the organic substance peeling apparatus, the concentration of each of the components of the chemical liquid stored in the circulation tank (chemical liquid tank) is measured, and only a component the concentration of which has lowered is added to the circulation tank, whereby the concentrations of the components of the chemical liquid stored in the circulation tank can be held within the respective predetermined ranges. The peeling performance of the chemical liquid can therefore be maintained at a high level, whereby the chemical liquid stored in the circulation tank can be repeatedly used to peel an organic substance formed on a semiconductor wafer.

SUMMARY OF THE INVENTION

In the above-mentioned processing liquid (chemical liquid) generator incorporated in an organic substance peeling apparatus, since the concentrations of the components of chemical liquid (processing liquid) is measured with a single concentration meter, the reliability of the concentration measurement depends on the single concentration meter. It cannot therefore be said that the concentration of generated processing liquid is always sufficiently reliable. The present invention has been made in view of the situation described above and provides a processing liquid generator capable of improving the reliability of the concentration of generated processing liquid.

The present invention further provides a substrate processing apparatus that processes a substrate with a processing liquid generated by the processing liquid generator.

A processing liquid generator according to the present invention is a processing liquid generator that generates processing liquid having undergone concentration adjustment based on a concentration measured with a concentration meter and includes a processing liquid adjuster that adjusts the concentration of the processing liquid, a first processing liquid path through which the processing liquid flows to the processing liquid adjuster, a second processing liquid path through which the processing liquid flows to the processing liquid adjuster, a first concentration meter that measures the concentration of the processing liquid flowing through the first processing liquid path, the measured concentration being a concentration of a component involved in the concentration adjustment in the processing liquid adjuster, a second concentration meter that measures the concentration of the processing liquid flowing through the second processing liquid path, the measured concentration being a concentration of the component that is involved in the concentration adjustment in the processing liquid adjuster and should be measured with the first concentration meter in terms of concentration, a first valve mechanism that opens and closes the first processing liquid path, and a second valve mechanism that opens and closes the second processing liquid path.

In the configuration described above, when the first valve mechanism and the second valve mechanism open the first processing liquid path and the second processing liquid path, the processing liquid flows through the first processing liquid path into the processing liquid adjuster, and the processing liquid flows through the second processing liquid path into the processing liquid adjuster. In this state, the processing liquid adjuster can adjust the concentration of the processing liquid, that is, the concentration of the component in the processing liquid based on the concentration measured with at least one of the first concentration meter, which measures the concentration of the processing liquid flowing through the first processing liquid path, the measured concentration being the concentration of a component involved in the concentration adjustment, and the second concentration meter, which measures the concentration of the processing liquid flowing through the second processing liquid path, the measured concentration being the concentration of the component that is involved in the concentration adjustment and should be measured with the first concentration meter in terms of concentration.

When the first valve mechanism opens the first processing liquid path and the second valve mechanism closes the second processing liquid path, the processing liquid does not flow through the second processing liquid path but flows through the first processing liquid path into the processing liquid adjuster. In this state, the processing liquid adjuster can adjust the concentration of the processing liquid, that is, the concentration of the component in the processing liquid based on the concentration of the processing liquid flowing through the first processing liquid path, the concentration measured with the first concentration meter, which measures the concentration of the component involved in the concentration adjustment.

When the first valve mechanism closes the first processing liquid path and the second valve mechanism opens the second processing liquid path, the processing liquid does not flow through the first processing liquid path or pass through the first concentration meter but flows through the second processing liquid path and passes through the second concentration meter into the processing liquid adjuster. In this state, the processing liquid adjuster can adjust, based on the concentration measured with the second concentration meter, the concentration of the processing liquid, that is, the concentration of the component that is contained in the processing liquid and should be adjusted in terms of concentration.

A substrate processing apparatus according to the present invention includes a processing liquid generator that generates processing liquid having undergone concentration adjustment based on a concentration measured with a concentration meter, a table that holds a substrate, a drive mechanism that rotates the table, and a processing liquid supply mechanism that supplies the processing liquid generated by the processing liquid generator onto a surface of the substrate that rotates along with the table, and the processing liquid generator includes a processing liquid adjuster that adjusts the concentration of the processing liquid, a first processing liquid path through which the processing liquid flows to the processing liquid adjuster, a second processing liquid path through which the processing liquid flows to the processing liquid adjuster, a first concentration meter that measures the concentration of the processing liquid flowing through the first processing liquid path, the measured concentration being a concentration of a component involved in the concentration adjustment in the processing liquid adjuster, a second concentration meter that measures the concentration of the processing liquid flowing through the second processing liquid path, the measured concentration being a concentration of the component that is involved in the concentration adjustment in the processing liquid adjuster and should be measured with the first concentration meter in terms of concentration, a first valve mechanism that opens and closes the first processing liquid path, and a second valve mechanism that opens and closes the second processing liquid path.

The processing liquid generator according to the present invention can improve the reliability of the concentration of the generated processing liquid.

The substrate processing apparatus according to the present invention can process a substrate with the processing liquid generated by the processing liquid generator.

DETAILED DESCRIPTION OF THE PREFERRED EMBODIMENTS

An embodiment of the present invention will be described below with reference to the drawings.

Figure 1:
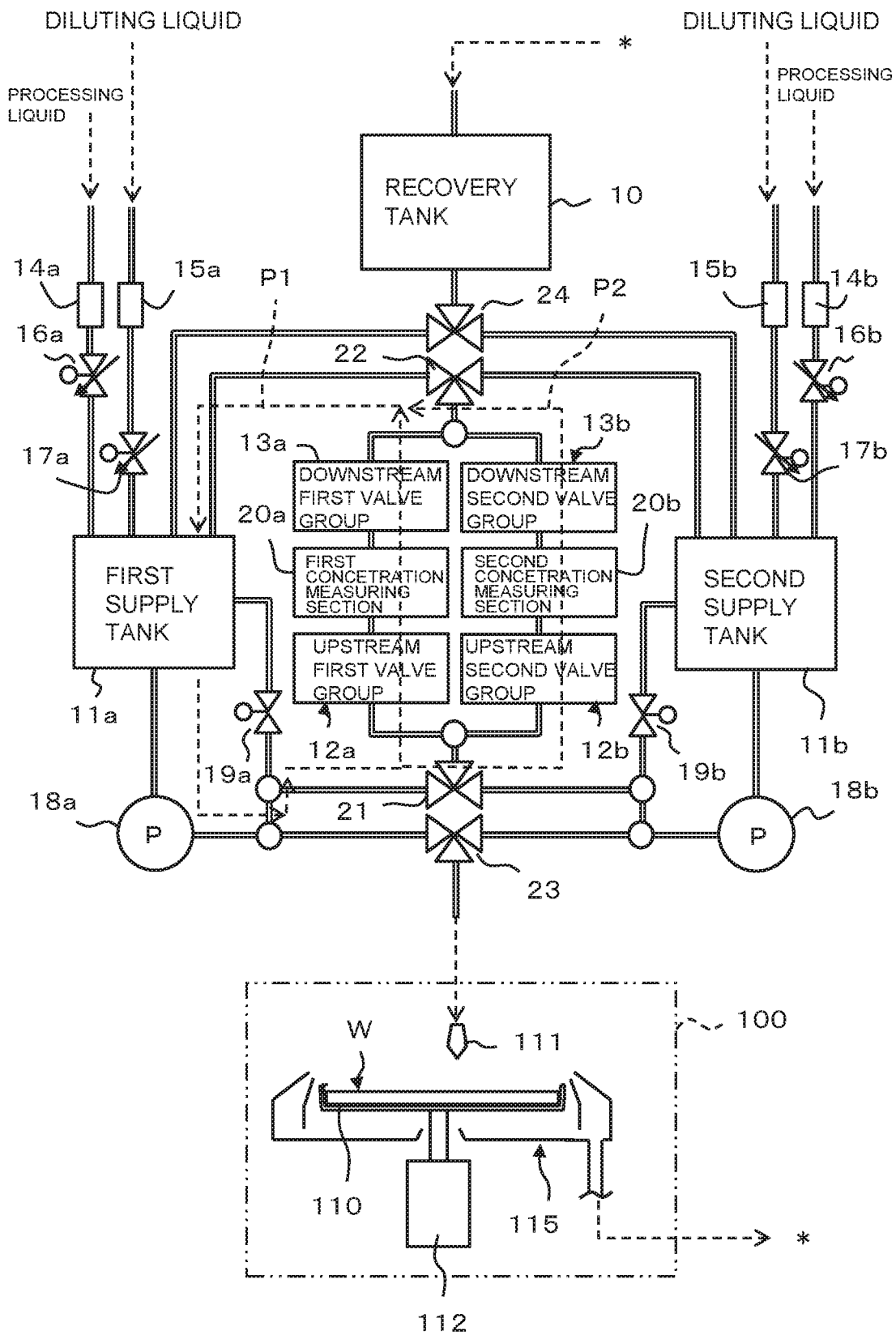
FIG. 1 shows a substrate processing apparatus including processing liquid generators according to an embodiment of the present invention.

A substrate processing apparatus including a processing liquid generator according to the embodiment of the present invention is configured as shown in FIG. 1.

In FIG. 1, the substrate processing apparatus includes two processing liquid generators, two processing liquid supply (processing liquid supply mechanism)/recovery systems, and a spinner 100. One of the processing liquid generator includes a first supply tank 11a, two integrating flowmeters 14a and 15a, two adjustment valves 16a and 17a, a first pump 18a, an open/close valve 19a, two three-way valves 21 and 22 in a generation/circulation system, an upstream first valve group 12a, an upstream second valve group 12b, a first concentration measuring section 20a, a second concentration measuring section 20b, a downstream first valve group 13a, and a downstream second valve group 13b. The other processing liquid generator shares the two three-way valves 21 and 22 in the generation/circulation system, the upstream first valve group 12a, the upstream second valve group 12b, the first concentration measuring section 20a, the second concentration measuring section 20b, the downstream first valve group 13a, and the downstream second valve group 13b with the one processing liquid generator and further includes a second supply tank 11b, two integrating flowmeters 14b and 15b, two adjustment valves 16b and 17b, a second pump 18b, and an open/close valve 19b. The one processing liquid supply/recovery system shares the first supply tank 11a and the first pump 18a with the one processing liquid generator described above and further includes three-way valves 23 and 24 and a recovery tank 10. The other processing liquid supply/recovery system shares the second supply tank 11b and the second pump 18b with the other processing liquid generator and further shares the recovery tank 10 and the two three-way valves 23 and 24 with the one processing liquid supply/recovery system described above.

Processing liquid generated in the first supply tank 11a with the concentration of the processing liquid adjusted is supplied from the first supply tank 11a via the three-way valve 23 to a nozzle 111 in the spinner 100 when the three-way valve 23 is so switched that the side thereof facing the first supply tank 11a is open and the first pump 18a is activated, and the processing liquid is discharged via the nozzle 111 (processing liquid supply mechanism). The spinner 100 is provided with a support stage 110 (table), which is rotated by a drive mechanism 112, such as a motor, and the nozzle 111 is so disposed as to face a semiconductor wafer W, the peripheral edge of which is supported by the support stage 110. A cup 115 is so provided as to extend from the side of the support stage 110 and cover the lower side thereof. The processing liquid (etchant, for example) discharged via the nozzle 111 is supplied onto the surface of the semiconductor wafer W, which rotates along with the support stage 110, and the processing liquid processes (etches) the surface of the semiconductor wafer W. The used processing liquid that spins off the surface of the rotating semiconductor wafer W is caught in the cup 115, further travels through a discharge path (not shown in the drawings), and is recovered in the recovery tank 10. The used processing liquid in the recovery tank 10 then travels through the three-way valve 24 so switched that the side thereof facing the first supply tank 11a is open and returns to the first supply tank 11a.

On the other hand, when the two three-way valves 23 and 24 are so switched that the sides thereof facing the second supply tank 11b are open, the processing liquid generated in the second supply tank 11b with the concentration of the processing liquid adjusted is supplied from the second supply tank 11b via the three-way valve 23 to the nozzle 111 of the spinner 100 with the aid of the action of the second pump 18b (processing liquid supply mechanism). In the same manner described above, the processing liquid discharged via the nozzle 111, supplied onto the surface of the rotating semiconductor wafer W in the spinner 100, and used there is recovered into the recovery tank 10, further travels from the recovery tank 10 via the three-way valve 24, and returns to the second supply tank 11b.

The two processing liquid supply (processing liquid supply mechanisms)/recovery systems, which are so separated as to include the first supply tank 11a and the second supply tank 11b described above, respectively, are switched as appropriate from one to the other by the three-way valves 23 and 24 in accordance with the state of the processing liquid (such as quantity, concentration, and amount of impurities) in the supply tanks 11a and 11b. As a result, the spinner 100 can keep processing the surface of the semiconductor wafer W by using processing liquid in a proper state (such as concentration).

A specific configuration of the processing liquid generators will next be described. Since the two processing liquid generators share the upstream first valve group 12a, the upstream second valve group 12b, the downstream first valve group 13a, the downstream second valve group 13b, the first concentration measuring section 20a, the second concentration measuring section 20b, and the two three-way valves 21 and 22, include a plurality of components of the same type, and operate in the same manner, one of the processing liquid generators that includes the first supply tank 11a will be described.

A liquid path provided with the integrating flowmeter 14a and the adjustment valve 16a is connected to the first supply tank 11a, and raw processing liquid (phosphoric acid aqueous solution as etchant, for example) is supplied through the liquid path to the first supply tank 11a. A liquid path provided with the integrating flowmeter 15a and the adjustment valve 17a is connected to the first supply tank 11a, and diluting liquid (pure water, for example) is supplied through the liquid path to the first supply tank 11a.

A circulation liquid path is so formed as to start from the first supply tank 11a, extends via the first pump 18a and the open/close valve 19a, and returns to the first supply tank 11a. Further, a liquid path P1 is so formed as to start from the first supply tank 11a, extends via the first pump 18a, the three-way valve 21, the upstream first valve group 12a, the first concentration measuring section 20a, the downstream first valve group 13a, and the three-way valve 22, and returns to the first supply tank 11a. The liquid path P1 is hereinafter referred to as a first circulation liquid path P1 (first processing liquid path). Further, a liquid path P2 is so formed as to start from the first supply tank 11a, extends via the first pump 18a, the three-way valve 21, the upstream second valve group 12b, the second concentration measuring section 20b, the downstream second valve group 13b, and the three-way valve 22, and returns to the first supply tank 11a. The liquid path P2 is hereinafter referred to as a second circulation liquid path P2 (second processing liquid path).

Figure 2A:
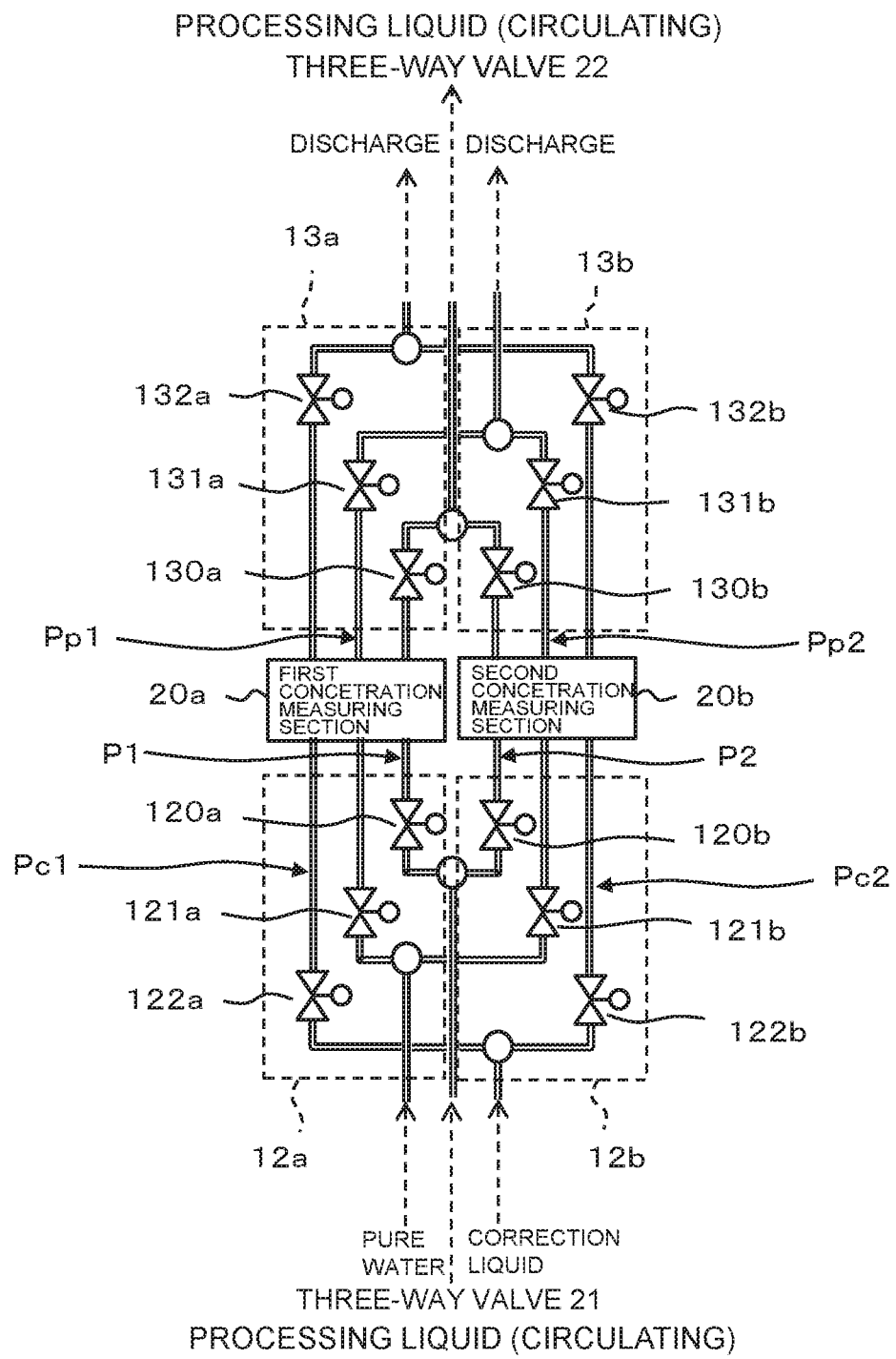
FIG. 2A shows an example of the configurations of an upstream first valve group, an upstream second valve group, a downstream first valve group, and a downstream second valve group in each of the processing liquid generators shown in FIG. 1.

The upstream first valve group 12a, the upstream second valve group 12b, the downstream first valve group 13a, and the downstream second valve group 13b are configured as shown in FIG. 2A.

The upstream first valve group 12a includes an open/close valve 120a, which is provided in the first circulation liquid path P1, which extends via the three-way valve 21, and the upstream second valve group 12b includes an open/close valve 120b, which is provided in the second circulation liquid path P2, which extends via the three-way valve 21. The downstream first valve group 13a includes an open/close valve 130a, which is provided in the first circulation liquid path P1, which extends via the first concentration measuring section 20a toward the three-way valve 22, and the downstream second valve group 13b includes an open/close valve 130b, which is provided in the second circulation liquid path P2, which extends via the second concentration measuring section 20b toward the three-way valve 22.

The set of the open/close valve 120a, which is part of the upstream first valve group 12a, and the open/close valve 130a, which is part of the downstream first valve group 13a, is configured as a first valve mechanism that opens and closes the first circulation liquid path P1 (first processing liquid path). The set of the open/close valve 120b, which is part of the upstream second valve group 12b, and the open/close valve 130b, which is part of the downstream second valve group 13b, is configured as a second valve mechanism that opens and closes the second circulation liquid path P2 (second processing liquid path).

Although not shown in FIG. 1, the upstream first valve group 12a, the upstream second valve group 12b, the downstream first valve group 13a, and the downstream second valve group 13b each include a plurality of open/close valves that open and close other liquid paths. Specifically, two liquid paths Pc1 and Pp1, which pass through the first concentration measuring section 20a, are formed in addition to the first circulation liquid path P1, and two liquid paths Pc2 and Pp2, which pass through the second concentration measuring section 20b, are formed in addition to the second circulation liquid path P2, as shown in FIG. 2A. The liquid path Pc1 is a liquid path that starts from a liquid source of correction liquid used to correct a concentration meter in the first concentration measuring section 20a and extends via the first concentration measuring section 20a toward a discharge section, and the liquid path Pc forms a first correction liquid path Pc1. The correction liquid described above can be liquid containing the same components as those of the processing liquid. Correction liquid having a known concentration is supplied to the first correction liquid path Pc1. It is noted that at least the concentration of the correction liquid passing through the concentration meter only needs to be known, and that the correction liquid may be directly supplied from the correction liquid source or the concentration of the correction liquid from the liquid source may be adjusted to a predetermined concentration and the adjusted correction liquid may then be supplied. The liquid path Pc2 is a liquid path that starts from the same correction liquid source and extends via the second concentration measuring section 20b toward the discharge section. The correction liquid flowing through the liquid path Pc2 is also used to correct a concentration meter in the second concentration measuring section 20b, and the liquid path Pc2 forms a second correction liquid path Pc2. The liquid path Pp1 is a liquid path extending from a pure water source via the first concentration measuring section 20a toward the discharge section and forms a first cleaning liquid path Pp1. The liquid path Pp2 is a liquid path extending from the same pure water source via the second concentration measuring section 20b toward the discharge section and forms a second cleaning liquid path Pp2.

The upstream first valve group 12a includes an open/close valve 121a, which is provided in the first cleaning liquid path Pp1, and an open/close valve 122a, which is provided in the first correction liquid path Pc1. The downstream first valve group 13a also includes an open/close valve 131a, which is provided in the first cleaning liquid path Pp1, and an open/close valve 132a, which is provided in the first correction liquid path Pc1. The upstream second valve group 12b includes an open/close valve 121b, which is provided in the second cleaning liquid path Pp2, and an open/close valve 122b, which is provided in the second correction liquid path Pc2. The downstream second valve group 13b also includes an open/close valve 131b, which is provided in the second cleaning liquid path Pp2, and an open/close valve 132b, which is provided in the second correction liquid path Pc2.

The set of the open/close valve 122a in the upstream first valve group 12a and the open/close valve 132a in the downstream first valve group 13a is configured as a third valve mechanism that opens and closes the first correction liquid path Pc1. The set of the open/close valve 122b in the upstream second valve group 12b and the open/close valve 132b in the downstream second valve group 13b is configured as a fourth valve mechanism that opens and closes the second correction liquid path Pc2. The set of the open/close valve 121a in the upstream first valve group 12a and the open/close valve 131a in the downstream first valve group 13a is configured as a fifth valve mechanism that opens and closes the first cleaning liquid path Pp1, and the set of the open/close valve 121b in the upstream second valve group 12b and the open/close valve 131b in the downstream second valve group 13b is configured as a sixth valve mechanism that opens and closes the second cleaning liquid path Pp2.

Figure 2B:
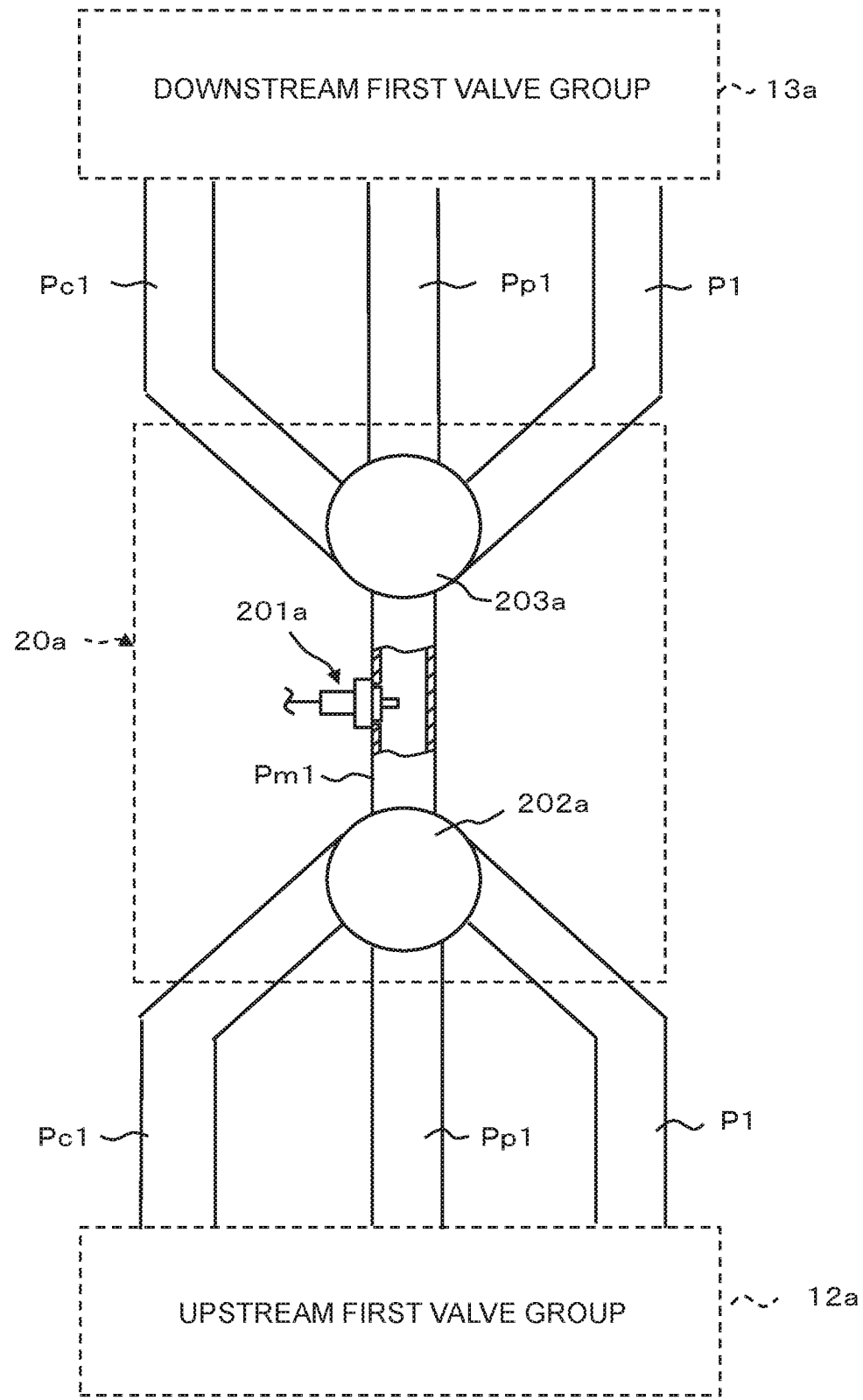
FIG. 2B shows an example of the configuration of a first concentration measuring section shown in FIG. 2A.
Figure 2C:
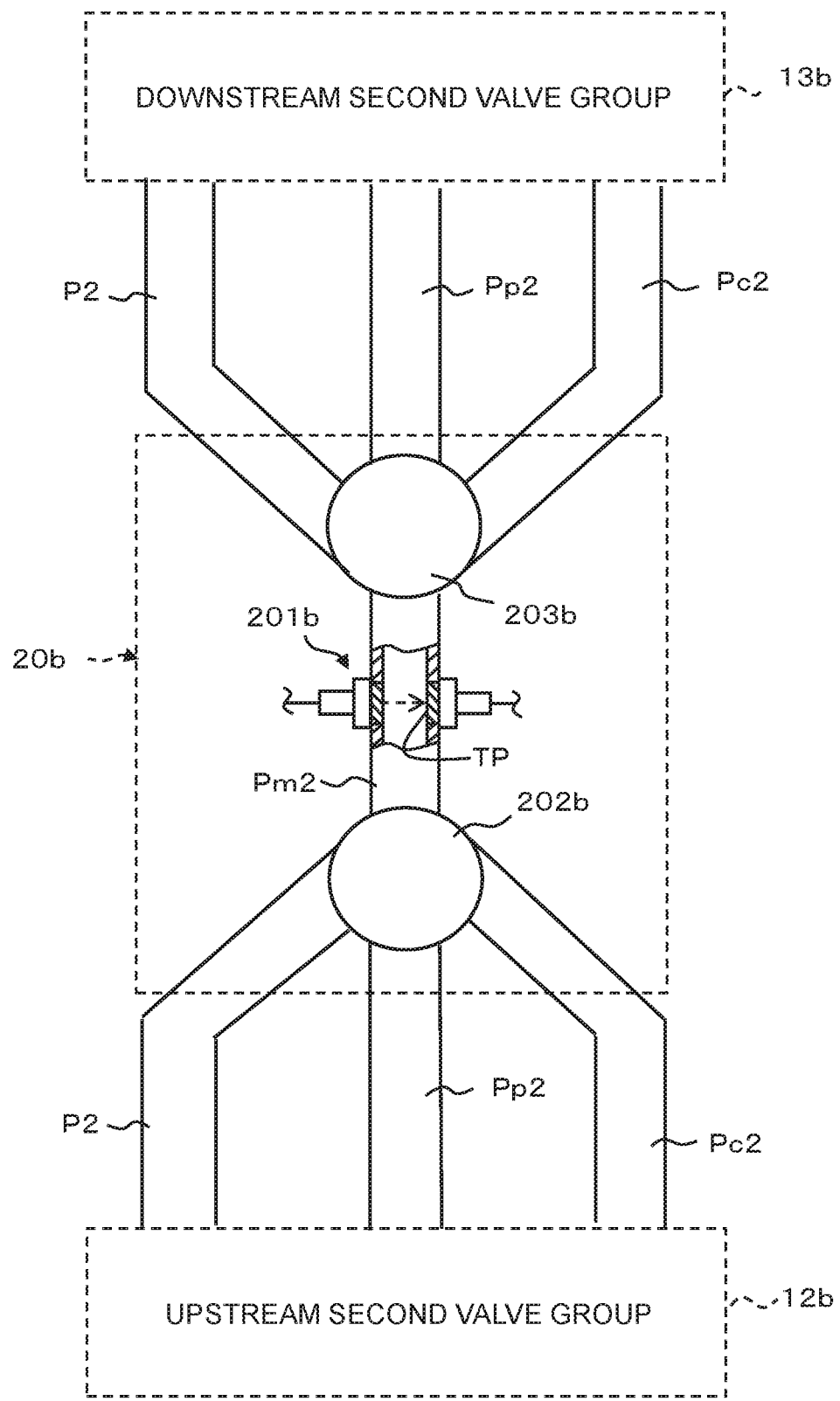
FIG. 2C shows an example of the configuration of a second concentration measuring section shown in FIG. 2A.

The first concentration measuring section 20a is configured, for example, as shown in FIG. 2B, and the second concentration measuring section 20b is configured, for example, as shown in FIG. 2C.

The first concentration measuring section 20a includes a first concentration meter 201a, an upstream first switch valve 202a, and a downstream first switch valve 203a, as shown in FIG. 2B. The three liquid paths formed of the first circulation liquid path P1, the first correction liquid path Pc1, and the first cleaning liquid path Pp1, which are provided with the upstream first valve group 12a and the downstream first valve group 13a, as described above, are connected in parallel to the upstream first switch valve 202a on the upstream side in the first concentration measuring section 20a and connected in parallel to the downstream first switch valve 203a on the downstream side in the first concentration measuring section 20a to form a single liquid path Pm1, which couples the upstream first switch valve 202a and the downstream first switch valve 203a to each other. The first concentration meter 201a is provided in the liquid path Pm1.

In the thus configured first concentration measuring section 20a, when switching actions of the upstream first switch valve 202a and the downstream first switch valve 203a allow the liquid path Pm1 to communicate with the first circulation liquid path P1, the processing liquid flowing through the first circulation liquid path P1 flows through the liquid path Pm1. As a result, the first concentration meter 201a can measure the concentration of the processing liquid flowing through the liquid path Pm1, that is, the concentration of the processing liquid flowing through the first circulation liquid path P1. Further, when switching actions of the upstream first switch valve 202a and the downstream first switch valve 203a allow the liquid path Pm1 to communicate with the first correction liquid path Pc1, the correction liquid flowing through the first correction liquid path Pc1 flows through the liquid path Pm1, whereby the first concentration meter 201a can be corrected. Further, when switching actions of the upstream first switch valve 202a and the downstream first switch valve 203a allow the liquid path Pm1 to communicate with the first cleaning liquid path Pp1, the cleaning liquid flowing through the first cleaning liquid path Pp1 flows through the liquid path Pm1, whereby the liquid path Pm1 and the first concentration meter 201a can be cleaned with the cleaning liquid.

The second concentration measuring section 20b includes a second concentration meter 201b, an upstream second switch valve 202b, and a downstream second switch valve 203b, as shown in FIG. 2C. The three liquid paths formed of the second circulation liquid path P2, the second correction liquid path Pc2, and the second cleaning liquid path Pp2, which are provided with the upstream second valve group 12b and the downstream second valve group 13b, as described above, are connected in parallel to the upstream second switch valve 202b on the upstream side in the second concentration measuring section 20b and connected in parallel to the downstream second switch valve 203b on the downstream side in the second concentration measuring section 20b to form a single liquid path Pm2, which couples the upstream second switch valve 202b and the downstream second switch valve 203b to each other. The second concentration meter 201b is provided in the liquid path Pm2.

In the thus configured second concentration measuring section 20b, when switching actions of the upstream second switch valve 202b and the downstream second switch valve 203b allow the liquid path Pm2 to communicate with the second circulation liquid path P2, the processing liquid flowing through the second circulation liquid path P2 flows through the liquid path Pm2, whereby the second concentration meter 201b can measure the concentration of the processing liquid flowing through the liquid path Pm2, that is, the concentration of the processing liquid flowing through the second circulation liquid path P2. Further, when switching actions of the upstream second switch valve 202b and the downstream second switch valve 203b allow the liquid path Pm2 to communicate with the second correction liquid path Pc2, the correction liquid flowing through the second correction liquid path Pc2 flows through the liquid path Pm2, whereby the second concentration meter 201b can be corrected. Further, when switching actions of the upstream second switch valve 202b and the downstream second switch valve 203b allow the liquid path Pm2 to communicate with the second cleaning liquid path Pp2, the cleaning liquid flowing through the second cleaning liquid path Pp2 flows through the liquid path Pm2, whereby the liquid path Pm2 and the second concentration meter 201b can be cleaned with the cleaning liquid.

The first concentration meter 201a, which is provided in the first concentration measuring section 20a, and the second concentration meter 201b, which is provided in the second concentration measuring section 20b, measure the concentration of the processing liquid (correction liquid) flowing through the concentration measuring sections 20a and 20b on the basis of different measurement principles and output measurement signals corresponding to the measured concentrations. That is, the first concentration meter 201a and the second concentration meter 201b measure the concentrations of the processing liquid flowing through the first circulation liquid path P1 and the second circulation liquid path P2 (in more detail, processing liquid flowing through liquid paths Pm1 and Pm2) on the basis of different measurement principles. The first concentration meter 201a (see FIG. 2B) can be a concentration meter that measures the concentration, for example, on the basis of the electrical conductivity of target liquid. The second concentration meter 201b can, for example, be a concentration meter that is formed of a laser light source and a light receiver so provided as to sandwich a transparent section TP of the liquid path Pm2, as shown in FIG. 2C, and optically measures the concentration of target liquid. The first concentration meter 201a and the second concentration meter 201b can instead each be, for example, a concentration meter that measures the concentration by using an ultrasonic wave or a concentration meter that measures the concentration by using infrared rays.

The first concentration meter 201a and the second concentration meter 201b measure, as the concentration of the processing liquid, the concentration of the same component that forms the processing liquid and is involved in the concentration adjustment in the first supply tank 11a and the second supply tank 11b (each of which is part of processing liquid adjuster). For example, in a case where the processing liquid is an etching processing liquid formed of a phosphoric acid aqueous solution and the adjustment of the concentration of the phosphoric acid in the etching processing liquid is performed as the adjustment of the concentration of the processing liquid, the first concentration meter 201a and the second concentration meter 201b measure the concentration of the phosphoric acid in the etching processing liquid as the concentration of the processing liquid. Further, in general, even in a case where the processing liquid contains a plurality of components, the first concentration meter 201a and the second concentration meter 201b measure, as the concentration of the processing liquid, the concentration of the same component involved in the concentration adjustment in the first supply tank 11a and the second supply tank 11b (each of which is part of processing liquid adjuster).

At least one of the first concentration meter 201a and the second concentration meter 201b can measure the concentration of a plurality of components (concentration of phosphoric acid and concentration of water, for example) in some cases. In a case where one of the concentration meters measures the concentrations of a plurality of components including a component involved in the concentration adjustment, the other concentration meter only needs to measure at least the concentration of the component involved in the concentration adjustment. As a result, both the first concentration meter 201a and the second concentration meter 201b can measure at least the concentration of the component involved in the concentration adjustment, whereby the concentration of the component in the processing liquid can be adjusted on the basis of the concentration measured by at least one of the first concentration meter 201a and the second concentration meter 201b.

Figure 3:
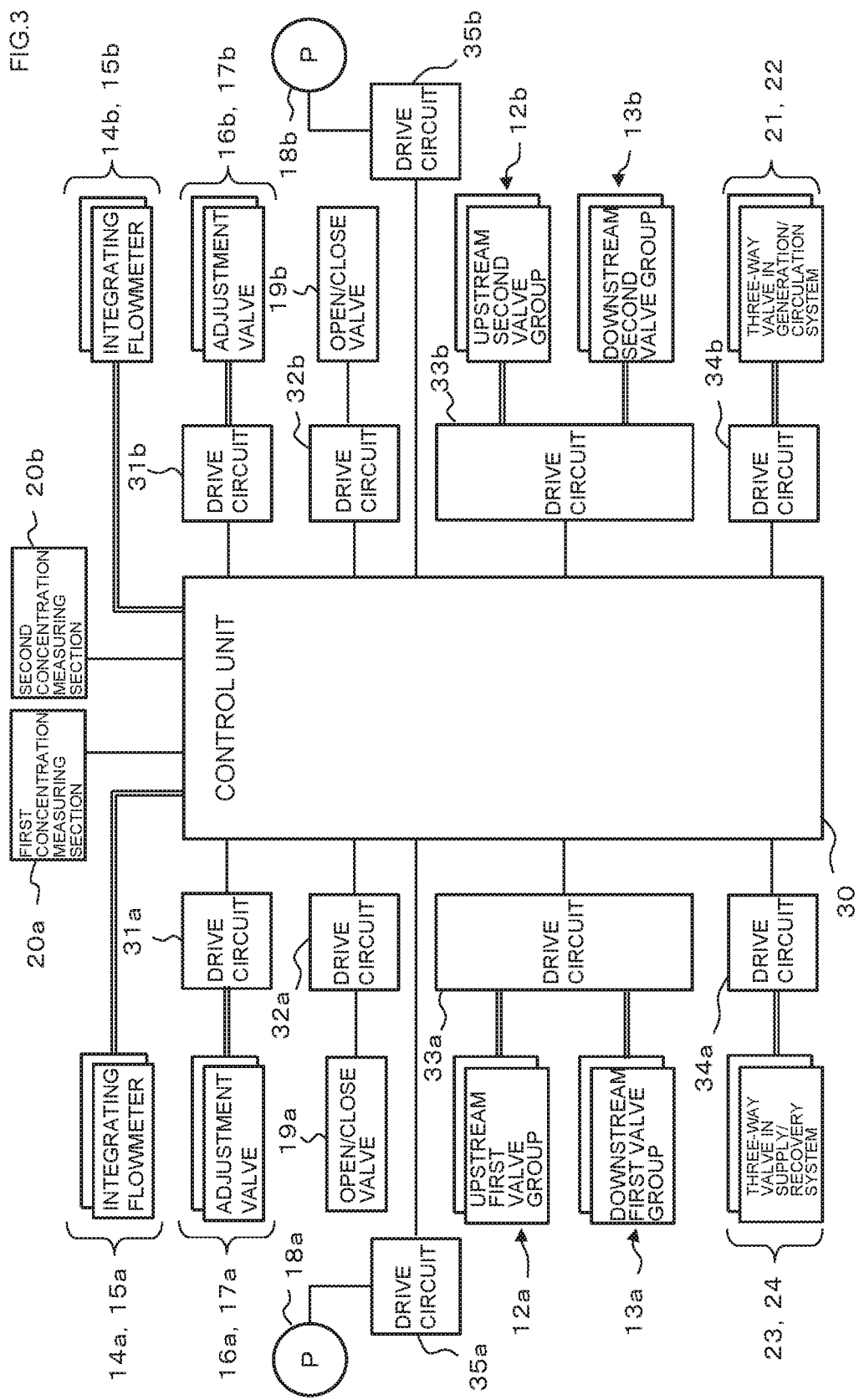
FIG. 3 is a block diagram showing an example of the configuration of a control system that controls each valve in the processing liquid generator shown in FIGS. 1, 2A to 2C.

A control system of the processing liquid generator configured as described above is configured, for example, as shown in FIG. 3.

In FIG. 3, the processing liquid generator includes a control unit 30. The control unit 30 drives and controls the upstream first switch valve 202a and the downstream first switch valve 203a in the first concentration measuring section 20a (see FIG. 2B) and drives and controls the upstream second switch valve 202b and the downstream second switch valve 203b in the second concentration measuring section 20b (see FIG. 2C) in such a way that the liquid path Pm1 communicates with the first circulation liquid path P1 in the first concentration measuring section 20a and the liquid path Pm2 communicates with the second circulation liquid path P2 in the second concentration measuring section 20b. In this state, the control unit 30 controls a drive circuit 31a, which drives the adjustment valves 16a and 17a, which are provided in the two liquid paths through which the processing liquid and the diluting liquid are supplied to the first supply tank 11a, while monitoring information on the flow rate of the processing liquid (etching processing liquid that is phosphoric acid aqueous solution, for example) from the integrating flowmeter 14a and information on the flow rate of the diluting liquid (pure water, for example) from the integrating flowmeter 15a, on the basis of the concentrations measured by the first concentration measuring section 20a (first concentration meter 201a, see FIG. 2B) and the second concentration measuring section 20b (second concentration meter 201b, see FIG. 2C). The concentration of the processing liquid (concentration of phosphoric acid, for example) generated in the first supply tank 11a is thus adjusted. The control unit 30 further controls a drive circuit 31b, which drives the adjustment valves 16b and 17b, which are provided in the two liquid paths through which the processing liquid and the diluting liquid are supplied to the second supply tank 11b, while monitoring information on the flow rate of the processing liquid from the integrating flowmeter 14b and information on the flow rate of the diluting liquid from the integrating flowmeter 15b, on the basis of the values measured by the first concentration measuring section 20a and the second concentration measuring section 20b. The concentration of the processing liquid generated in the second supply tank 11b is thus adjusted. The concentration adjustment will be described later in detail.

The control unit 30 controls a drive circuit 34a, which drives and switches the three-way valve 23 in the processing liquid supply/recovery system in order to switch the source from which the processing liquid is supplied to the spinner 100 (nozzle 111) to one of the first supply tank 11a and the second supply tank 11b. The control unit 30 further controls the drive circuit 34a, which drives and switches the three-way valve 24 in the processing liquid supply/recovery system in order to switch the destination to which the used processing liquid having returned from the spinner 100 to the recovery tank 10 is delivered to one of the first supply tank 11a and the second supply tank 11b.

The control unit 30 controls a drive circuit 34b, which controls and switches the three-way valves 21 and 22 in the generation/circulation system in order to switch the reservoir of the processing liquid to be circulated via the first concentration measuring section 20a and the second concentration measuring section 20b and adjusted in terms of concentration to one of the first supply tank 11a and the second supply tank 11b. In the concentration adjustment, the control unit 30 controls a drive circuit 33a, which opens and closes the open/close valve 120a in the upstream first valve group 12a and the open/close valve 130a in the downstream first valve group 13a provided in the first circulation liquid path P1 (see FIG. 2A). In this process, the control unit 30 further controls a drive circuit 33b, which opens and closes the open/close valve 120b in the upstream second valve group 12b and the open/close valve 130b in the downstream second valve group 13b provided in the second circulation liquid path P2 (see FIG. 2A).

Further, in the correction of the first concentration meter 201a in the first concentration measuring section 20a, the control unit 30 controls the drive circuit 33a, which opens and closes the open/close valve 122a in the upstream first valve group 12a and the open/close valve 132a in the downstream first valve group 13a provided in the first correction liquid path Pc1 (see FIG. 2) and opens and closes the open/close valve 121a in the upstream first valve group 12a and the open/close valve 131a in the downstream first valve group 13a provided in the first cleaning liquid path Pp1 (see FIG. 2). In this process, in the first concentration measuring section 20a (see FIG. 2B), the control unit 30 controls and switches the upstream first switch valve 202a and the downstream first switch valve 203a in such a way that the state in which the liquid path Pm1 communicates with the first correction liquid path Pc1 and the state in which the liquid path Pm1 communicates with the first cleaning liquid path Pp1 is switched from one to the other. Further, in the correction of the second concentration meter 201b in the second concentration measuring section 20b, the control unit 30 controls the drive circuit 33b, which opens and closes the open/close valve 122b in the upstream second valve group 12b and the open/close valve 132b in the downstream second valve group 13b provided in the second correction liquid path Pc2 (see FIG. 2) and opens and closes the open/close valve 121b in the upstream second valve group 12b and the open/close valve 131b in the downstream second valve group 13b provided in the second cleaning liquid path Pp2 (see FIG. 2A). In this process, in the second concentration measuring section 20b (see FIG. 2C), the control unit 30 controls and switches the upstream second switch valve 202b and the downstream second switch valve 203b in such a way that the state in which the liquid path Pm2 communicates with the second correction liquid path Pc2 and the state in which the liquid path Pm2 communicates with the second cleaning liquid path Pp2 is switched from one to the other. The control unit 30 further controls a drive circuit 35a, which drives the first pump 18a, and a drive circuit 35b, which drives the second pump 18b. The control unit 30 further controls a drive circuit 32a, which opens and closes the open/close valve 19a, and a drive circuit 32b, which opens and closes the open/close valve 19b.

Figure 4A:
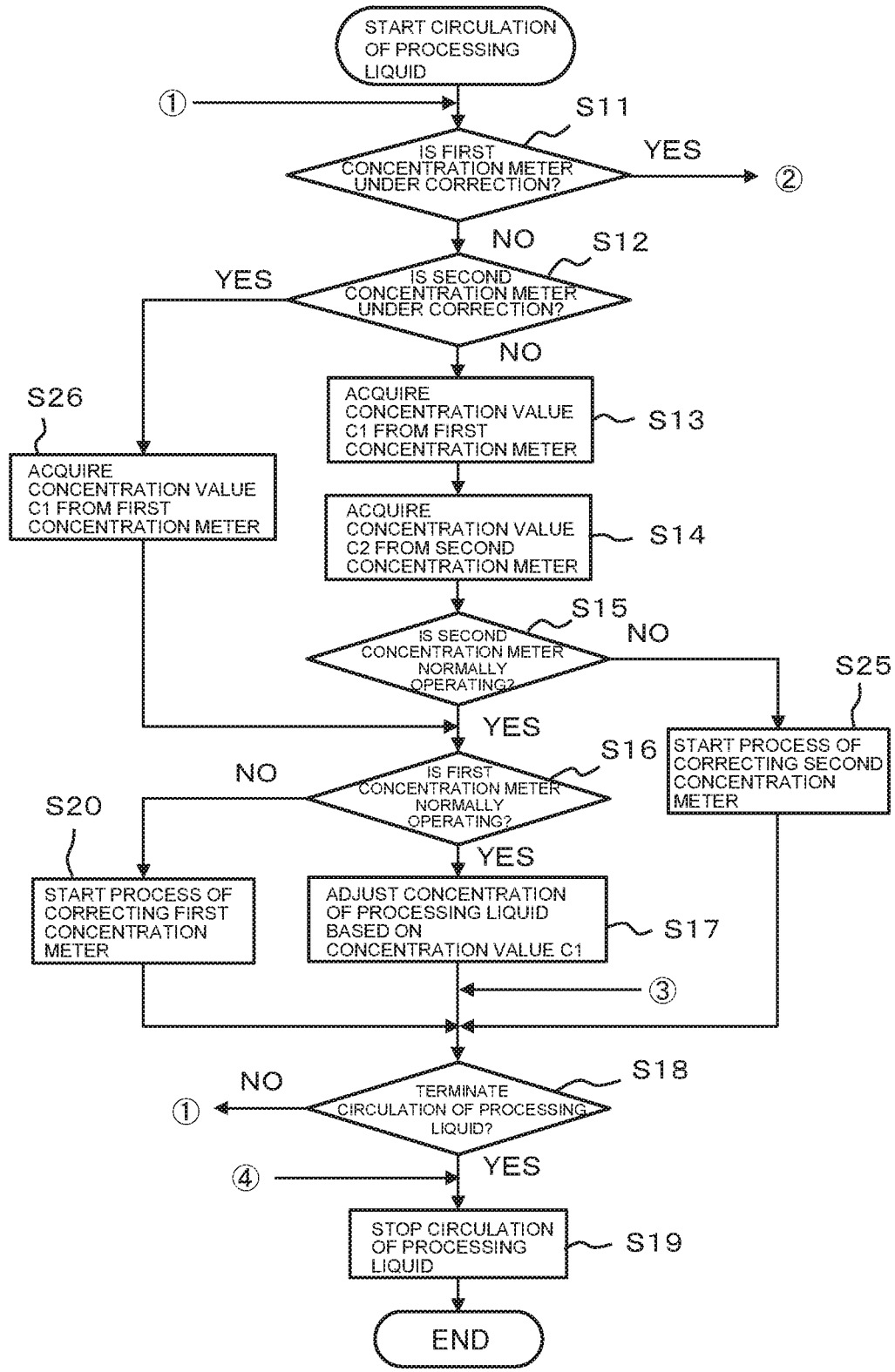
FIG. 4A is a flowchart (no. 1) showing an example of the procedure of processes carried out by a control unit in the control system shown in FIG. 3.
Figure 4B:
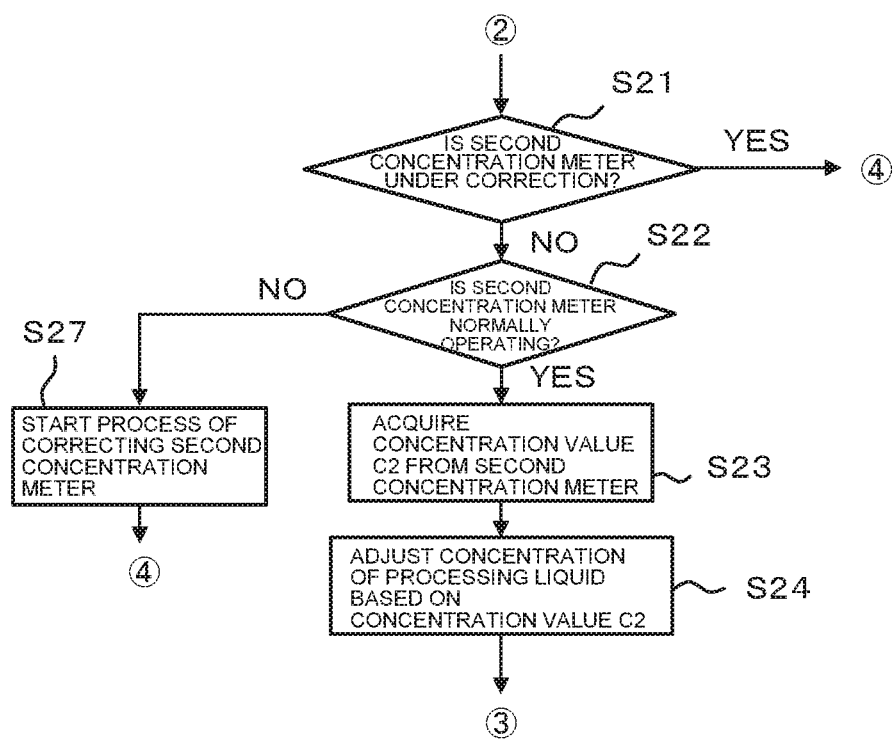
FIG. 4B is a flowchart (no. 2) showing an example of the procedure of processes carried out by the control unit in the control system shown in FIG. 3.

The control unit 30 carries out a process involved in the adjustment of the concentration of the processing liquid (phosphoric acid aqueous solution as etching processing liquid, for example) generated in the first supply tank 11a and the second supply tank 11b in accordance with the procedure shown in FIGS. 4A and 4B. In the following description, a process involved in the adjustment of the concentration of the processing liquid generated in the first supply tank 11a will be described, and a process involved in the adjustment of the concentration of the processing liquid generated in the second supply tank 11b is carried out in the same procedure.

The control unit 30 opens the adjustment valves 16a and 17a while monitoring the information on the flow rate from the integrating flowmeters 14a and 15a and closes the adjustment valves 16a and 17a when predetermined amounts of processing liquid (raw liquid) and diluting liquid are stored in the first supply tank 11a. The control unit 30 then drives the first pump 18a with the open/close valve 19a open and the three-way valves 21 and 23 so set that the sides thereof facing the first supply tank 11a are closed. As a result, the processing liquid and the diluting liquid that exit from the first supply tank 11a circulate in such a way that they travel through the circulation liquid path provided with the open/close valve 19a and return to the first supply tank 11a. In this process, the processing liquid and the diluting liquid are mixed with each other into diluted processing liquid in the first supply tank 11a. The mechanism as a whole that allows the processing liquid and the diluting liquid to be so mixed with each other in the first supply tank 11a that the concentration of the processing liquid (concentration of phosphoric acid in etchant, for example) is adjusted, that is, the configuration involved in the generation of the processing liquid in the first supply tank 11a functions as the processing liquid adjuster.

The control unit 30 then switches the open/close valve 19a to the closed state and switches the three-way valves 21 and 22 in the circulation system in such a way that the side thereof facing the first supply tank 11a is open. In this process, the control unit 30 opens the open/close valve 120a in the upstream first valve group 12a and the open/close valve 130a in the downstream first valve group 13a (first valve mechanism, see FIG. 2A) provided in the first circulation liquid path P1 and opens the open/close valve 120b in the upstream second valve group 12b and the open/close valve 130b in the downstream second valve group 13b (second valve mechanism, see FIG. 2A) provided in the second circulation liquid path P2. In this state, the processing liquid having exited from the first supply tank 11a circulates in such a way that it travels through the first circulation liquid path P1 and the second circulation liquid path P2 in parallel and returns to the first supply tank 11a.

When the processing liquid starts circulating through the first circulation liquid path P1 and the second circulation liquid path P2, as described above, the control unit 30 starts carrying out processes in accordance with the procedure shown in FIGS. 4A and 4B.

In FIG. 4A, the control unit 30 checks whether or not the first concentration measuring section 20a (first concentration meter 201a, see FIG. 2B) and the second concentration measuring section 20b (second concentration meter 201b, see FIG. 2C) are under correction (S11, S12). In a case where neither the first concentration measuring section 20a nor the second concentration measuring section 20b is under correction (NO in S11, NO in S12), the control unit 30 acquires a concentration C1 based on a measurement signal from the first concentration meter 201a (first concentration measuring section 20a) and a concentration C2 based on a measurement signal from the second concentration meter 201b (second concentration measuring section 20b) (S13, S14). The control unit 30 then evaluates whether or not the second concentration meter 201b is normally operating (S15: second evaluation section (processing liquid valve controller)) and whether or not the first concentration meter 201a is normally operating (S16: first evaluation section (processing liquid valve controller)) on the basis of the two measured concentrations C1 and C2.

Since the first concentration meter 201a and the second concentration meter 201b measure the concentration of the same processing liquid (specifically, concentration of phosphoric acid in etching processing liquid), the measured concentrations are intrinsically equal to each other. Therefore, in a case where the difference between the concentration C1 measured with the first concentration meter 201a and the concentration C2 measured with the second concentration meter 201b falls within a predetermined range set in advance, it can be determined that the first concentration meter 201a and the second concentration meter 201b are normally operating. On the other hand, there is a low possibility of an abrupt change in the concentration of the circulating processing liquid. There is also a low possibility of simultaneous failure of the first concentration meter 201a and the second concentration meter 201b. In particular, since the principle on the basis of which the first concentration meter 201a measures the concentration and the principle on basis of which the second concentration meter 201b measures the concentration differ from each other, the possibility of simultaneous failure of the first concentration meter 201a and the second concentration meter 201b used in environments similar to each other is further low. Therefore, in a state in which the concentration measured with one of the concentration meters stably progresses, when the concentration measured with the other concentration meter abruptly changes (for example, in a case where the difference between the concentration measured with one of the concentration meters and the concentration measured with the other concentration meter exceeds the predetermined range set in advance and the width of the change per unit time in the concentration measured with the other concentration meter exceeds an allowable value set in advance, or in a case where the width of the change per unit time in the concentration measured with the other concentration meter exceeds an allowable value set in advance), it can be determined that the other concentration meter is not normally operating. That is, in the present embodiment, a self-diagnosis function of diagnosing the concentration meters is provided. In a case where the concentration C1 measured with the first concentration meter 201a and the concentration C2 measured with the second concentration meter 201b both abruptly change, but the difference between the measured concentration C1 and the measured concentration C2 is within the allowable range set in advance, it can be determined that the first concentration meter 201a and the second concentration meter 201b are both normally operating, and that the concentration of the processing liquid is not properly adjusted in the first supply tank 11a.

In the case where it is determined that the second concentration meter 201b and the first concentration meter 201a are both normally operating (YES in S15, YES in S16), the control unit 30 carries out the process of adjusting the concentration of the processing liquid on the basis of the concentration C1 measured with the first concentration meter 201a (S17). Specifically, the control unit 30 adjusts the open/close states of the adjustment valves 16a and 17a while monitoring the information on the flow rate from the integrating flowmeters 14a and 15a in such a way that the measured concentration C1 is equal to a target concentration. The control unit 30 then evaluates whether or not a condition for terminating the circulation for the adjustment of the concentration of the processing liquid has been satisfied, for example, whether or not a predetermined period has elapsed, the measured concentration C1 has reached a value within a predetermined concentration range formed of ranges on opposite sides of the target concentration, or any other condition has satisfied (S18). In a case where a result of the evaluation shows that the condition for terminating the circulation for the adjustment of the concentration of the processing liquid has not been satisfied (NO in step S18), the control unit 30 carries out the processes according to the same procedure described above (S11 to S18). The control unit 30 then repeats the processes in accordance with the same procedure (S11 to S18) in the situation in which the first concentration meter 201a and the second concentration meter 201b are normally operating. As a result, the concentration of the processing liquid is adjusted (specifically, concentration of phosphoric acid in etching processing liquid is adjusted) in the first supply tank 11a (processing liquid adjuster) on the basis of the concentration C1 measured with the first concentration meter 201a, and processing liquid the concentration of which has been adjusted to the target concentration set in advance (specifically, etching processing liquid containing phosphoric acid the concentration of which has been adjusted to target concentration) is generated. When a predetermined period has elapsed since the circulation for the adjustment of the concentration of the processing liquid started or the condition for terminating the circulation for adjusting the concentration of the processing liquid has been satisfied, for example, the measured concentration C1 has reached a value within the predetermined concentration range formed of ranges on opposite sides of the target concentration (YES in S18), the control unit 30 stops the first pump 18a, switches the open/close valve 120a in the upstream first valve group 12a and the open/close valve 130a in the downstream first valve group 13a (first valve mechanism, see FIG. 2A) provided in the first circulation liquid path P1 to the closed state, and switches the open/close valve 120b in the upstream second valve group 12b and the open/close valve 130b in the downstream second valve group 13b (second valve mechanism, see FIG. 2A) provided in the second circulation liquid path P2 to the closed state. The circulation for the adjustment of the concentration of the processing liquid in the first supply tank 11a is thus stopped.

In the course of the processes described above, the control unit 30 determines that the first concentration meter 201a is not normally operating (NO in step S16) in a situation in which the concentration C1 measured with the first concentration meter 201a abruptly changes in the state in which the concentration C2 measured with the second concentration meter 201b is stable (for example, a situation in which the difference between the concentration measured with the first concentration meter 201a and the concentration measured with the second concentration meter 201b exceeds the predetermined range set in advance and the width of the change per unit time in the concentration C1 detected with the first concentration meter 201a exceeds the allowable value set in advance), the control unit 30 switches the open/close valve 120a in the upstream first valve group 12a and the open/close valve 130a in the downstream first valve group 13a (first valve mechanism, see FIG. 2A) provided in the first circulation liquid path P1 to the closed state (function of first valve controller (processing liquid valve controller)) and starts the process of correcting the first concentration meter 201a (S20). In this state, the switching actions of the upstream first switch valve 202a and the downstream first switch valve 203a in the first concentration measuring section 20a described above (see FIG. 2B) allow correction of the first concentration meter 201a to be performed with no processing liquid supplied to the first concentration meter 201a (liquid path Pm1). The correction process will be described later. In a case where a result of the evaluation shows that the condition for terminating the circulation for the adjustment of the concentration of the processing liquid has not been satisfied (NO in S18), the control unit 30 then further evaluates whether or not the first concentration meter 201a is under correction (S11).

Since the process of correcting the first concentration meter 201a has started, and the control unit 30 determines that the first concentration meter 201a is under correction (YES in S11), proceeds to the procedure shown in FIG. 4B, and evaluates whether or not the second concentration meter 201b (second concentration measuring section 20b, see FIG. 2C) is under correction (S21). In a case where the second concentration meter 201b is not under correction (NO in S21), the control unit 30 evaluates whether or not the second concentration meter 201b is normally operating on the basis of whether or not the concentration C2 measured with the second concentration meter 201b keeps stable measured values (for example, whether or not the width of the change per unit time in the concentration C2 detected with the second concentration meter 201b exceeds an allowable value set in advance) (S22). In a case where a result of the evaluation shows that the second concentration meter 201b is normally operating (YES in S22), the control unit 30 acquires the concentration C2 based on a measurement signal from the second concentration meter 201b (S23) and carries out the process of adjusting the concentration of the processing liquid on the basis of the measured concentration C2 (S24). Specifically, the control unit 30 adjusts the open/close states of the adjustment valves 16a and 17a while monitoring the information on the flow rate from the integrating flowmeters 14a and 15a in such a way that the measured concentration C2 is equal to the target concentration. The control unit 30 then returns to the procedure in FIG. 4A and evaluates whether or not the condition for terminating the circulation for the adjustment of the concentration of the processing liquid has been satisfied (S18). In the case where the condition for terminating the circulation for the adjustment of the concentration of the processing liquid has not been satisfied (NO in S18), the control unit 30 carries out the processes according to the same procedure described above. In this case, since the first concentration meter 201a is under correction, the concentration of the processing liquid is adjusted in the first supply tank 11a (processing liquid adjuster) on the basis of the concentration C2 measured with the second concentration meter 201b, and processing liquid having the adjusted concentration (specifically, etching processing liquid containing phosphoric acid having adjusted concentration) is generated. In the case where the condition for terminating the circulation for the adjustment of the concentration of the processing liquid is satisfied, for example, the measured concentration C2 has reached a value within the predetermined concentration range formed ranges on opposite sides of the target concentration (YES in S18), the control unit 30, for example, stops the first pump 18a to terminate the circulation for the adjustment of the concentration of the processing liquid (S19), as described above.

In the situation described above in which the concentration of the processing liquid is being adjusted in the first supply tank 11a (specifically, concentration of phosphoric acid in etching processing liquid is being adjusted) on the basis of the concentration C2 measured with the second concentration meter 201b, when the correction of the first concentration meter 201a is completed, the control unit 30 determines that neither the first concentration meter 201a (first concentration measuring section 20a) nor the second concentration meter 201b (second concentration measuring section 20b) is under correction (NO in S11, NO in S12), and the control unit 30 therefore switches the closed open/close valve 120a in the upstream first valve group 12a and the closed open/close valve 130a in the downstream first valve group 13a (first valve mechanism, see FIG. 2A) provided in the first circulation liquid path P1 to the open state and then repeats the same procedure described above (S11 to S18). As a result, the concentration of the processing liquid is adjusted in the first supply tank 11a on the basis of the concentration C1 measured with the first concentration meter 201a again.

Further, in the case where the first concentration meter 201a and the second concentration meter 201b are both normally operating, and in the course of the concentration adjustment based on the concentration C1 measured with the first concentration meter 201a (S11 to S18), for example, when the measured concentration C2 abruptly changes with the measured concentration C1 stably maintained (for example, when the difference between the concentrations obtained from the first concentration meter 201a and the second concentration meter 201b exceeds the predetermined range set in advance and the width of the change per unit time in the concentration C2 detected with the second concentration meter 201b exceeds the allowable value set in advance), and it is therefore determined that the second concentration meter 201b is not normally operating (NO in S15), the control unit 30 switches the open/close valve 120b in the upstream second valve group 12b and the open/close valve 130b in the downstream second valve group 13b (second valve mechanism, see FIG. 2A) provided in the second circulation liquid path P2 to the closed state (function of second valve controller (processing liquid valve controller)), then switches the upstream second switch valve 202b and the downstream second switch valve 203b in the second concentration measuring section 20b (see FIG. 2C), and starts correction of the second concentration meter 201b (S25). The control unit 30 then checks if the first concentration meter 201a is not under correction but the second concentration meter 201b is under correction (NO in S11, YES in S12), acquires the concentration C1 based on a measurement signal from the first concentration meter 201a (S26), checks if the measured concentration C1 keeps stable measured values (in this case, for example, checks if the width of the change per unit time in the concentration C1 detected with the first concentration meter 201a does not exceed the allowable value set in advance), that is, checks if the first concentration meter 201a is normally operating (YES in S16), and adjusts the concentration of the processing liquid in the first supply tank 11a (specifically, adjusts concentration of phosphoric acid in etching processing liquid) on the basis of the measured concentration C1 (S17).

In a case where the first concentration meter 201a is under correction and the second concentration meter 201b has been providing stable measured concentrations C2 but the concentration C2 measured with the second concentration meter 201b abruptly changes (for example, the width of the change per unit time in the concentration C2 detected with the second concentration meter 201b exceeds the allowable value set in advance), so that it is determined that the second concentration meter 201b is not normally operating (NO in S22 in FIG. 4B), the control unit 30 further switches the open/close valve 120b in the upstream second valve group 12b and the open/close valve 130b in the downstream second valve group 13b (second valve mechanism, see FIG. 2A) provided in the second circulation liquid path P2 to the closed state and then starts correction of the second concentration meter 201b (S27). In this situation, since the first concentration meter 201a and the second concentration meter 201b are both under correction, the control unit 30, for example, stops the first pump 18a to terminate the circulation for the adjustment of the concentration of the processing liquid (S19). Further, when it is determined that the first concentration meter 201a and the second concentration meter 201b are both under correction (YES in S11 in FIG. 4A, YES in S21 in FIG. 4B), the control unit 30, for example, stops the first pump 18a also in this case to terminate the circulation for the adjustment of the concentration of the processing liquid (S19).

In the apparatus that performs the concentration adjustment in accordance with the procedure described above to generate processing liquid (processing liquid generator), even when it is determined that the first concentration meter 201a is not normally operating, the adjustment of the concentration of the processing liquid (specifically, adjustment of concentration of phosphoric acid in etching processing liquid) continues on the basis of the concentration C2 measured with the second concentration meter 201b having been determined to be normally operating, whereby a situation in which the concentration of the processing liquid is continuously adjusted on the basis of the concentration measured with a concentration meter that is not normally operating is avoided, and the reliability of the concentration of the generated processing liquid can therefore be improved.

Further, even when one of the concentration meters is under correction, the other concentration meter can be used to measure an accurate concentration, whereby the adjustment of the concentration of the processing liquid does not need to be suspended but can be continued.

Further, even if one of the concentration meters is defective, the concentration adjustment continues on the basis of the concentration measured with the other concentration meter, whereby the efficiency of the process involved in the adjustment of the concentration of the processing liquid can be improved.

In the processes described above, in the case where the first concentration meter 201a and the second concentration meter 201b are both normally operating, the concentration adjustment is performed on the basis of the concentration C1 measured with the first concentration meter 201a (see S17). The concentration adjustment can instead be performed on the basis of the concentrations C1 and C2 measured with the first concentration meter 201a and the second concentration meter 201b, for example, the average of the concentrations C1 and C2.

Figure 5:
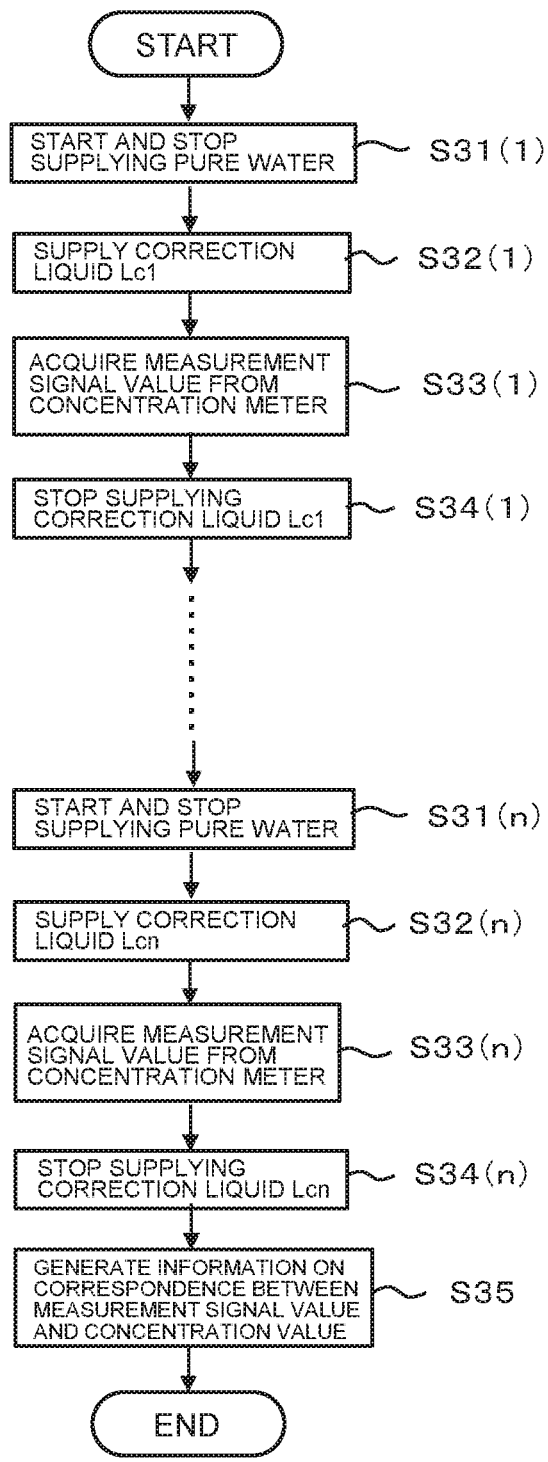
FIG. 5 is a flowchart showing an example of the procedure of correction of a concentration meter.

The correction described above is performed in accordance with the procedure shown in FIG. 5. The correction is performed on both the first concentration meter 201a in the first concentration measuring section 20a (see FIG. 2B) and the second concentration meter 201b in the second concentration measuring section 20b (see FIG. 2C), and the same correction is performed on the two concentration meters. The following description will therefore be made with reference to the correction performed on the first concentration meter 201a in the first concentration measuring section 20a (see FIG. 2B).

The control unit 30 switches the open/close valve 120a in the upstream first valve group 12a and the open/close valve 130a in the downstream first valve group 13a (first valve mechanism, see FIG. 2) provided in the first circulation liquid path P1 to the closed state and then carries out processes according to the procedure shown in FIG. 5. In FIG. 5, the control unit 30 switches the open/close valve 121a in the upstream first valve group 12a and the open/close valve 131a in the downstream first valve group 13a (fifth valve mechanism, see FIG. 2) provided in the first cleaning liquid path Pp1 to the open state and causes the upstream first switch valve 202a and the downstream first switch valve 203a to operate in such a way that the liquid path Pm1 in the first concentration measuring section 20a communicates with the first cleaning liquid path Pp1. After the cleaning liquid (pure water, for example) is caused to flow through the first cleaning liquid path Pp1 for a predetermined period, the control unit 30 switches the open/close valves 121a and 131a (fifth valve mechanism) to the closed state (S31(1)). As a result, the cleaning liquid flowing through the first cleaning liquid path Pp1 flows through the liquid path Pm1, which is provided with the first concentration meter 201a in the first concentration measuring section 20a, whereby the first concentration meter 201a (concentration detector) along with the liquid path Pm1 is cleaned.

Thereafter, the control unit 30 switches the open/close valves 121a and 131a provided in the first cleaning liquid path Pp1 to the closed state, then switches the open/close valve 122a in the upstream first valve group 12a and the open/close valve 132a in the downstream first valve group 13a (third valve mechanism, see FIG. 2A) provided in the first correction liquid path Pc1 to the open state (function of first correction liquid valve controller (corresponding to second correction liquid valve controller)), and causes the upstream first switch valve 202a and the downstream first switch valve 203a to operate in such a way that the liquid path Pm1 provided with the first concentration meter 201a communicates with the first correction liquid path Pc1. First correction liquid Lc1, the concentration of which is known, is caused to flow through the first correction liquid path Pc1 (S32(1)). The first correction liquid Lc1 flowing through the first correction liquid path Pc1 therefore flows through the liquid path Pm1 provided with the first concentration meter 201a (concentration detector) in the first concentration measuring section 20a. In this state, the control unit 30 acquires the value of a measurement signal (level value, for example) outputted from the first concentration meter 201a (S33(1)). The control unit 30 then stops supplying the first correction liquid Lc1 (S34(1)).

Thereafter, the correction liquid is successively switched to correction liquid having a different concentration, and the same processes (S31(n) to S34(n)) are repeatedly carried out until the correction liquid is switched to n-th correction liquid Lcn. The control unit 30 then generates information on the correspondence between the measurement signal value and the concentration (S35: first correction processor (corresponding to second correction processor)) on the basis of the relationship (correlation) between the concentrations of the correction liquid Lc1 to Lcn and the corresponding measurement signal values. The control unit 30 then updates, on the basis of the correspondence information, a table showing the correspondence between the measurement signal value and the concentration stored in relation to the first concentration meter 201a. As described above, in the present embodiment, the self-correction function of correcting a concentration meter having been determined not to be normally operating is provided. After the self-correction described above is completed, the control unit 30 refers to the correspondence table to acquire the concentration C1 based on the measurement signal from the first concentration meter 201a.

In the present embodiment, the self-correction function of correcting a concentration meter has been described with reference to the case where correction liquid is successively switched to correction liquid having a different concentration to update the table showing the correspondence between the measurement signal value and the concentration. The correction function, however, may instead be achieved by using only correction liquid having a known specific concentration. For example, in the state in which the first cleaning liquid path Pp1 communicates with the liquid path Pm1, after the cleaning liquid is caused to flow for a predetermined period set in advance, the first correction liquid path Pc1 is caused to communicate with the liquid path Pm1, and the correction liquid having the specific concentration is caused to flow through the liquid path Pm1. In this state, the control unit 30 acquires the value of the measurement signal outputted from the first concentration meter 201a. In a case where the concentration C1 measured with the first concentration meter 201a coincides with the specific concentration of the correction liquid caused to flow through the liquid path Pm1, it can be determined that dirt and other foreign matter that have adhered to the electrodes in the concentration meters and the inner surface of the liquid path provided with the concentration meter have been removed and the concentration meter has therefore been corrected to the normal state. The function of carrying out the process described above may be employed as the correction function. Further, in a case where the concentration C1 measured with the first concentration meter 201a does not coincide with the specific concentration of the correction liquid caused to flow through the liquid path Pm1, the supply of the cleaning liquid to the liquid path Pm1 and the supply of the correction liquid may be repeated by a number set in advance at the maximum.

After the correction described above is completed, the control unit 30 switches the open/close valves 122a and 132a provided in the first correction liquid path Pc1 to the closed state and switches the open/close valves 120a and 130a provided in the first circulation liquid path P1 to the open state (first valve restoration control means (corresponding to second valve restoration control means)). The first concentration meter 201a in the first concentration measuring section 20a can therefore be restored to the adjustment of the concentration of the processing liquid.

In the substrate processing apparatus shown in FIG. 1, when the adjustment of the concentration of the processing liquid (specifically, adjustment of concentration of phosphoric acid in etching processing liquid) in the first supply tank 11a is completed as described above, the three-way valves 21 and 22 are so switched that the sides thereof facing the second supply tank 11b (processing liquid adjuster) are open, and the three-way valves 23 and 24 are so switched that the sides thereof facing the first supply tank 11a are open. In this state, the action of the first pump 18a allows the processing liquid (specifically, etching processing liquid) so generated in the first supply tank 11a that the concentration thereof is adjusted to be supplied from the first supply tank 11a to the spinner 100 (nozzle 111), and the processing liquid supplied from the first supply tank 11a processes (etches) the surface of the semiconductor wafer W in the spinner 100. The used processing liquid recovered from the spinner 100 returns via the recovery tank 10 to the first supply tank 11a.

In the state in which the processing liquid is supplied from the first supply tank 11a to the spinner 100 as described above, the processes involved in the adjustment of the concentration of the processing liquid are carried out in the second supply tank 11b in accordance with the procedure described above (see FIGS. 4A and 4B, etc.), and processing liquid having a predetermined concentration is generated. Thereafter, the adjustment of the concentration of the processing liquid in the first supply tank 11a and the second supply tank 11b and the supply of the processing liquid to the spinner 100 are continuously performed with the adjustment and the supply switched from one to the other.

In the apparatus that performs the correction in accordance with the procedure described above (processing liquid generator), even a concentration meter having been determined not to be normally operating can restore the normal state by itself by using the self-correction function, whereby the reliability of the concentration of the processing liquid can be increased. Further, since the self-diagnosis function described above is also provided, the reliability of the processing liquid can be always increased.

Since the cleaning liquid path used to clean a concentration meter itself or the inner surface of a liquid path provided with a concentration meter is separately provided, when the concentration meter is cleaned during the correction of the concentration meter, dirt having adhered to the conductive plate (electrode) of the concentration meter and the inner surface of the liquid path will not enter the circulation liquid path through which the processing liquid flows and the correction liquid path through which the correction liquid flows.

In the embodiment described above, the first concentration meter 201a and the second concentration meter 201b measure the concentration of the processing liquid on the basis of different measurement principles. However, concentration meters that operate on the basis of the same principle may instead be used, considering that there is a low possibility of simultaneous failure of the two concentration meters.

In FIG. 2A, the first circulation liquid path P1, the first correction liquid path Pc1, and the first cleaning liquid path Pp1 are provided separately from one another. The three liquid paths may instead be integrated into a single pipe having a three-way valve, and the processing liquid, the correction liquid, and the pure water may be caused to alternately flow through the single pipe to the first concentration measuring section 20a. The same holds true for the second circulation liquid path P2, the second correction liquid path Pc2, and the second cleaning liquid path Pp2, which are provided separately from one another in the second concentration measuring section 20b.

The above embodiment has been described with reference to the case where a concentration meter based on electrical conductivity is used as an example of the first concentration meter 201a (see FIG. 2B) and a concentration meter using a laser beam is used as an example of the second concentration meter 201b (see FIG. 2C). In this case, the concentration meters are cleaned with a cleaning liquid as follows: In the first concentration meter 201a, for example, the conductive plate (electrode) provided in the first concentration meter 201a is cleaned; and in the second concentration meter 201b, for example, the inner surface of the liquid path is cleaned with the cleaning liquid.

In the embodiment described above, an etchant (phosphoric acid aqueous solution, for example) is used as the processing liquid by way of example, and any processing liquid that processes a target object and allows sensing the concentration of the processing liquid, such as resist remover, can be used. Further, the processing liquid may contain a plurality of components in addition to pure water. In this case, each of the concentration meters may measure the concentrations of all the components or may measure the concentrations of one or more of the components.

In the apparatus described above, the two concentration meters, the first concentration meter 201a and the second concentration meter 201b, are used, and three or more concentration meters may instead be used. In this case, any one of the three or more concentration meters can be used as the first concentration meter and another can be used as the second concentration meter, or any one of the three or more concentration meters can be assigned as the first or second concentration meter and the set of the remaining concentration meters can be assigned as the second or first concentration meter.

In the apparatus described above, each of the open/close valves, the three-way valves, and the adjustment valves is switched by a drive circuit controlled by the control unit 30, but the valves may instead be manually switched. In this case, an operator switches each of the valves in accordance with the same procedure described above while observing the concentrations measured with the first concentration meter 201a and the second concentration meter 201b.

In the apparatus described above, after the processing liquid having undergone the concentration adjustment is supplied from the supply tank 11a (11b) to the spinner 100, the used processing liquid returns as recovered liquid to the supply tank 11a (11b). In the configuration described above, it is preferable to adjust the concentration of the processing liquid in the supply tank 11a (11b) even when the processing liquid is supplied from the supply tank 11a (11b) to the spinner 100. In this case, for example, when the three-way valves 23 and 24 are so switched that the sides thereof facing the first supply tank 11a are open and the processing liquid in the first supply tank 11a is supplied to the spinner 100, the three-way valves 21 and 22 are also so switched that the sides thereof facing the first supply tank 11a are open. The actions of the adjustment of the concentration of the processing liquid in the first supply tank 11a and the self-correction function of correcting the concentration meters after the three-way valves 21 and 22 are so switched that the sides thereof facing the first supply tank 11a are open are the same as the actions described with reference to FIGS. 4A, 4B, and 5. Further, the actions performed when the processing liquid is supplied from the second supply tank 11b to the spinner 100 are the same as those described above. In the configuration described above, the concentration management is performed not only when the processing liquid supplied to the spinner 100 starts but when the processing liquid is being supplied, whereby the substrate can be appropriately processed with processing liquid that continuously undergoes the concentration management. Further, as long as at least one of the two concentration meters 201a and 201b is normally operating, the processing liquid can be continuously supplied to the spinner 100, and the continuous supply of the processing liquid can provide time for correcting the concentration meter having been determined not to be normally operating and can also contribute to improvement in yield.

Several embodiments of the present invention and variations of each portion have been described above. The embodiments and variations of each portion are presented by way of example and do not intend to limit the scope of the present invention. The novel embodiments described above can be implemented in a variety of other forms, and a variety of omissions, replacements, and changes can be made to the embodiments to the extent that the omissions, replacements, and changes do not depart from the substance of the present invention. The embodiments and variations fall within the scope and substance of the present invention and the inventive items set forth in the claims.

What is claimed is:

1. A processing liquid generator that generates processing liquid having undergone concentration adjustment based on a concentration measured with a concentration meter, the generator comprising:
   a processing liquid adjuster configured to adjust the concentration of the processing liquid;
   a first processing liquid path through which the processing liquid flows to the processing liquid adjuster;
   a second processing liquid path through which the processing liquid flows to the processing liquid adjuster;
   a first concentration meter that is provided in the first processing liquid path and is configured to measure the concentration of the processing liquid flowing through the first processing liquid path, the measured concentration being a concentration of a component involved in the concentration adjustment in the processing liquid adjuster;
   a second concentration meter that is provided in the second processing liquid path and is configured to measure the concentration of the processing liquid flowing through the second processing liquid path, the measured concentration being a concentration of the component that is involved in the concentration adjustment in the processing liquid adjuster and should be measured with the first concentration meter in terms of concentration;
   a first valve mechanism that is provided in the first processing liquid path and is switched between an open state in which flow of the processing liquid is allowed in the first processing liquid path and a closed state in which the flow of the processing liquid is stopped in the first processing liquid path; and
   a second valve mechanism that is provided in the second processing liquid path and is switched between an open state in which flow of the processing liquid is allowed in the second processing liquid path and a closed state in which the flow of the processing liquid is stopped in the second processing liquid path,
   wherein the first processing liquid path includes a first part which is provided with the first concentration meter and is not included in the second processing liquid path, and the second processing liquid path includes a second part which is provided with the second concentration meter and is not included in the first processing liquid path, and
   wherein the first valve mechanism includes two valves which are provided in the first part so as to sandwich the first concentration meter at an upstream side and at a downstream side in a flow direction of the processing liquid, and the second valve mechanism includes two valves which are provided in the second part so as to sandwich the second concentration meter at an upstream side and at a downstream side in a flow direction of the processing liquid, and
   the processing liquid generator further comprising:
   a control unit configured to control the two valves of the first valve mechanism so as to close the two valves of the first valve mechanism to stop the flow of the processing liquid in the first processing liquid path when determining that the first concentration meter is not normally operating, and to control two valves of the second valve mechanism so as to close the two valves of the second valve mechanism to stop the flow of the processing liquid in the second processing liquid path when determining that second concentration meter is not normally operating.

2. The processing liquid generator according to claim 1, wherein the first processing liquid path includes a first circulation liquid path through which the processing liquid returns from the processing liquid adjuster via the first concentration meter to the processing liquid adjuster, and
the second processing liquid path includes a second circulation liquid path through which the processing liquid returns from the processing liquid adjuster via the second concentration meter to the processing liquid adjuster.

3. The processing liquid generator according to claim 1, wherein the first concentration meter and the second concentration meter measure the concentration of the processing liquid based on different measurement principles.

4. The processing liquid generator according to claim 1, further comprising:
a first correction liquid path through which correction liquid having a known concentration flows to the first concentration meter;
a second correction liquid path through which correction liquid having a known concentration flows to the second concentration meter;
a third valve mechanism configured to open and to close the first correction liquid path; and
a fourth valve mechanism configured to open and to close the second correction liquid path.

5. The processing liquid generator according to claim 2, further comprising:
a first correction liquid path through which correction liquid having a known concentration flows to the first concentration meter;
a second correction liquid path through which correction liquid having a known concentration flows to the second concentration meter;
a third valve mechanism configured to open and to close the first correction liquid path; and
a fourth valve mechanism configured to open and to close the second correction liquid path.

6. The processing liquid generator according to claim 3, further comprising:
a first correction liquid path through which correction liquid having a known concentration flows to the first concentration meter;
a second correction liquid path through which correction liquid having a known concentration flows to the second concentration meter;
a third valve mechanism configured to open and to close the first correction liquid path; and
a fourth valve mechanism configured to open and to close the second correction liquid path.

7. The processing liquid generator according to claim 1, wherein the control unit is configured to control actions of the two valves of the first valve mechanism and the two valves of the second valve mechanism based on a first measured concentration obtained from the first concentration meter and a second measured concentration obtained from the second concentration meter.

8. The processing liquid generator according to claim 7, wherein the control unit includes:
a first evaluation section configured to evaluate that the first concentration meter is not normally operating when an amount of change per unit time in the concentration measured with the first concentration meter exceeds a set value, which is set in advance, and an amount of change per time unit in the concentration measured with the second concentration meter does not exceed the set value, and
a first valve controller configured to control the first valve mechanism in such a way that the first processing liquid path is closed when the first evaluation section has evaluated that the first concentration meter is not normally operating.

9. The processing liquid generator according to claim 7, wherein the control unit includes:
a second evaluation section configured to evaluate that the second concentration meter is not normally operating when an amount of change per unit time in the concentration measured with the second concentration meter exceeds a set value, which is set in advance, and an amount of change per time unit in the concentration measured with the first concentration meter does not exceed the set value, and
a second valve controller configured to control the second valve mechanism in such a way that the second processing liquid path is closed when the second evaluation section has evaluated that the second concentration meter is not normally operating.

10. The processing liquid generator according to claim 8, further comprising:
a first correction liquid path through which correction liquid having a known concentration flows to the first concentration meter; and
a third valve mechanism configured to open and to close the first correction liquid path;
wherein the control unit comprises:
a first correction liquid valve controller configured to control the third valve mechanism in such a way that the first correction liquid path is open when the first evaluation section has evaluated that the first concentration meter is not normally operating; and
a first correction processor configure to generate information on correspondence between the known concentration of each of a plurality of correction liquids having different concentrations as these liquids are successively switched to flow through the first correction liquid path and a measurement signal value output from the first concentration meter when each of the plurality of correction liquids flows through the first concentration meter and to update a correspondence table indicating correspondence between the measurement signal value and the concentration in relation to the first concentration meter based on the information, the correspondence table being used to obtain the concentration from the measurement signal value output from the first concentration meter.

11. The processing liquid generator according to claim 9, further comprising
a second correction liquid path through which correction liquid having a known concentration flows to the second concentration meter; and
a fourth valve mechanism configured to open and to close the second correction liquid path;
wherein the control unit comprises:
a second correction liquid valve controller configured to control the fourth valve mechanism in such a way that the second correction liquid path is open when the second evaluation section has evaluated that the second concentration meter is not normally operating; and
a second correction processor configured to generate information on correspondence between the known concentration of each of a plurality correction liquids having different concentrations as those liquids are successively switched to flow through the second correction liquid path and a measurement signal value output from the second concentration meter when each of the plurality of correction liquids flows through the second concentration meter and to update a correspondence table indicating correspondence between the measurement signal value and the concentration in relation to the second concentration meter based on the information, the correspondence table being used to obtain the concentration from the measurement signal value output from the second concentration meter.

12. The processing liquid generator according to claim 10, wherein the control unit comprises:
a first valve restoration controller configured to control the first valve mechanism so as to restore the first processing liquid path to be opened after the first correction processor has updated the correspondence table in relation to the first concentration meter.

13. The processing liquid generator according to claim 11, wherein the control unit comprises:
a second valve restoration controller configured to control the second valve mechanism so as to restore the second processing liquid path to be opened after the second correction processor has updated the correspondence table in relation to the second concentration meter.

14. A substrate processing apparatus comprising:
a processing liquid generator configured to generate processing liquid having undergone concentration adjustment based on a concentration measured with a concentration meter;
a table configured to hold a substrate;
a drive mechanism configured to rotate the table; and
a processing liquid supply mechanism configured to supply the processing liquid generated by the processing liquid generator onto a surface of the substrate that rotates along with the table,
wherein the processing liquid generator includes:
a processing liquid adjuster configured to adjust the concentration of the processing liquid,
a first processing liquid path through which the processing liquid flows to the processing liquid adjuster,
a second processing liquid path through which the processing liquid flows to the processing liquid adjuster,
a first concentration meter that is provided in the first processing liquid path and is configured to measure the concentration of the processing liquid flowing through the first processing liquid path, the measured concentration being a concentration of a component involved in the concentration adjustment in the processing liquid adjuster,
a second concentration meter that is provided in the second processing liquid path and is configured to measure the concentration of the processing liquid flowing through the second processing liquid path, the measured concentration being a concentration of the component that is involved in the concentration adjustment in the processing liquid adjuster and should be measured with the first concentration meter in terms of concentration,
a first valve mechanism that is provided in the first processing liquid path and is switched between an open state in which flow of the processing liquid is allowed in the first processing liquid path and a closed state in which the flow of the processing liquid is stopped in the first processing liquid path, and
a second valve mechanism that is provided in the second processing liquid path and is switched between an open state in which flow of the processing liquid is allowed in the second processing liquid path and a closed state in which the flow of the processing liquid is stopped in the second processing liquid path,
wherein the first processing liquid path includes a first part which is provided with the first concentration meter and is not included in the second processing liquid path, and the second processing liquid path includes a second part which is provided with the second concentration meter and is not included in the first processing liquid path, and wherein the first valve mechanism includes two valves which are provided in the first part so as to sandwich the first concentration meter at an upstream side and at a downstream side in a flow direction of the processing liquid, and the second valve mechanism includes two valves which are provided in the second part so as to sandwich the second concentration meter at an upstream side and at a downstream side in a flow direction of the processing liquid, and
the processing liquid generator further comprising:
a control unit configured to control the two valves of the first valve mechanism so as to close the two valves of the first valve mechanism to stop the flow of the processing liquid in the first processing liquid path when determining that the first concentration meter is not normally operating, and to control two valves of the second valve mechanism so as to close the two valves of the second valve mechanism to stop the flow of the processing liquid in the second processing liquid path when determining that second concentration meter is not normally operating.

15. The substrate processing apparatus according to claim 14,
wherein the first concentration meter and the second concentration meter measure the concentration of the processing liquid based on different measurement principles.

16. The substrate processing apparatus according to claim 14, further comprising:
a first correction liquid path through which correction liquid having a known concentration flows to the first concentration meter;
a second correction liquid path through which correction liquid having a known concentration flows to the second concentration meter;
a third valve mechanism configured to open and to close the first correction liquid path; and
a fourth valve mechanism configured to open and to close the second correction liquid path.

17. The substrate processing apparatus according to claim 14,
wherein the control unit is configured to control actions of the two valves of the first valve mechanism and the two valves of the second valve mechanism based on a first measured concentration obtained from the first concentration meter and a second measured concentration obtained from the second concentration meter.

18. The substrate processing apparatus according to claim 17,
wherein the control unit includes:
a first evaluation section configured to evaluate that the first concentration meter is not normally operating when an amount of change per unit time in the concentration measured with the first concentration meter exceeds a set value, which is set in advance, and an amount of change per unit time in the concentration measured with the second concentration meter does not exceed the set value, and
a first valve controller configured to control the first valve mechanism in such a way that the first processing liquid path is closed when the first evaluation section has evaluated that the first concentration meter is not normally operating.

19. The substrate processing apparatus according to claim 17, wherein the control unit includes:

a second evaluation section configured to evaluate that e second concentration meter is not normally operating when an amount of change per unit time in the concentration measured with the second concentration meter exceeds a set value, which is set in advance, and an amount of change per time in the concentration measured with the first concentration meter does not exceed the set value, and a second valve controller configured to control the second valve mechanism in such a way that the second processing liquid path is closed when the second evaluation section has evaluated that the second concentration meter is not normally operating.

* * * * *